United States Patent
Blome et al.

(10) Patent No.: US 7,926,021 B2
(45) Date of Patent: Apr. 12, 2011

(54) INSERTION OF ERROR DETECTION CIRCUITS BASED ON ERROR PROPAGATION WITHIN INTEGRATED CIRCUITS

(75) Inventors: Jason Andrew Blome, Ann Arbor, MI (US); Krisztian Flautner, Cambridge (GB); Daryl Wayne Bradley, Willingham (GB)

(73) Assignee: ARM Limited, Cambridge (GB)

( * ) Notice: Subject to any disclaimer, the term of this patent is extended or adjusted under 35 U.S.C. 154(b) by 723 days.

(21) Appl. No.: 11/887,106

(22) PCT Filed: Oct. 3, 2005

(86) PCT No.: PCT/GB2005/003800
§ 371 (c)(1),
(2), (4) Date: Sep. 25, 2007

(87) PCT Pub. No.: WO2007/034128
PCT Pub. Date: Mar. 29, 2007

(65) Prior Publication Data
US 2009/0049331 A1    Feb. 19, 2009

(30) Foreign Application Priority Data
Sep. 22, 2005    (GB) .................................. 0519363.6

(51) Int. Cl.
*G06F 17/50* (2006.01)
(52) U.S. Cl. ..................................................... 716/136
(58) Field of Classification Search .............. 716/1, 4–6, 716/100, 136; 714/3, 718, 719; 365/200, 365/201
See application file for complete search history.

(56) References Cited

U.S. PATENT DOCUMENTS
2001/0013110 A1*    8/2001    Pierce et al. .................. 714/718

OTHER PUBLICATIONS

Mohanram K et al.: "Cost-effective approach for reducing soft error failure rate in logic circuits," IEEE, Proceedings International Test Conference 2003, North Carolina, Sep. 30-Oct. 2, 2003, vol. 1, pp. 893-901.

Seong Woo Kim et al.: "Soft error sensitivity characterization for microprocessor dependability enhancement strategy," IEEE, Proceedings International Conference on Dependable Systems and Networks, California, Jun. 23, 2002. pp. 416-425.

Mukherjee S S et al.: "A systematic methodology to compute the architectural vulnerability factors for a high-performance microprocessor," IEEE, Microarchitecture, 2003, Micro-36 Proceedings, 36th Annual IEEE/ACM International Symposium on Dec. 3-5, 2003, New Jersey, pp. 29-40.

(Continued)

*Primary Examiner* — Vuthe Siek
(74) *Attorney, Agent, or Firm* — Nixon & Vanderhye P.C.

(57) ABSTRACT

A method of selecting where error detection circuits should be placed within an integrated circuit uses simulation of a reference and test design with errors injected into the test design and then fan out analysis performed upon those injected errors to identify error propagation characteristics. Thus, registers at which propagated errors are highly likely to manifest themselves or which protect key architectural state, or which protect state not otherwise protected can be identified and so an efficient deployment of error detection mechanisms achieved. Within an integrated circuit output signals from inactive circuit elements may be subject to isolation gating in dependence upon a detected current state of the integrated circuit. Thus, inactive circuit elements in which soft errors occur have inappropriate output signals gated from reaching the rest of the integrated circuit and thus reducing erroneous operation.

7 Claims, 5 Drawing Sheets

OTHER PUBLICATIONS

Blome J et al.: "A Microsarchitectural Analysis of Soft Error Propagation in a Production-Level Embedded Microprocessor," 38th International Symposium on Microarchitecture, [online], Nov. 13, 2005, pp. 1-8, www.cs.binghamton.edu/{oguz/war2005/papers/war_final3.pdf>, retrieved on Jan. 24, 2006.

Anghel L. et al.: "Cost Reduction and Evaluation of a Temporary Faults Detecting Technique,", IEEE, Mar. 27, 2000, pp. 591-598.

Caldwell D W et al.: "A minimalist hardware architecture for using commercial microcontrollers in space," IEEE, Oct. 26, 1997, Digital Avionics Systems Conference, 16th DASC., AIAA/IEEE, California, pp. 5.2-26(left-hand column)—5.2-30 (right-hand column).

International Search Report mailed Jun. 2, 2006.

Written Opinion of the International Searching Authority dated Jun. 2, 2006.

International Preliminary Report on Patentability dated Aug. 29, 2007.

* cited by examiner

US 7,926,021 B2

INSERTION OF ERROR DETECTION CIRCUITS BASED ON ERROR PROPAGATION WITHIN INTEGRATED CIRCUITS

This application is the U.S. national phase of International Application No. PCT/GB2005/003800 filed 3 Oct. 2005 which designated the U.S. and claims priority to GB 0519363.6 filed 22 Sep. 2005, the entire contents of each of which are hereby incorporated by reference.

This invention relates to the field of integrated circuits. More particularly, this invention relates to the control of error propagation, such as, for example, errors induced by radiated particle strikes, within integrated circuits.

Device scaling trends towards reducing feature size, increasing integration and lowering voltage levels increase the soft error rate (non-permanent errors such as those induced by radiation strikes) within microprocessors and integrated circuits in general by lowering the minimum amount of charge necessary to cause a bit flip and also by increasing the number of susceptible targets for potential particle strikes. These trends have made reliability an increasingly important design constraint in a variety of different integrated circuit markets.

Though strict reliability constraints have typically been applied exclusively in aero space and high-end server markets, increase in demand for embedded microprocessors in a variety of emerging areas, such as the automotive and health care industries, have generated a requirement for reliable embedded designs. The standard mechanism for reporting device reliability is the number of failures in time, or the FIT rate, where a rate of one FIT means that the mean time before an error occurs is one billion device hours. As an example of the increasing need for reliability in embedded devices, the case of expanding integration in the automotive industry is typical. Due to the very high numbers of automobiles in use, and the multiple instances of embedded microprocessors within those automobiles, this indicates that with current technology at any given time multiple device failures due to soft errors would occur. This is unacceptable.

Another significant factor contributing to this problem is that in typical embedded devices compared with high performance design, longer clock cycle times tend to be employed. This longer cycle time in embedded designs typically leads to larger logic depths between sequential state elements. The effects of these large logic depths are two-fold. First, large logic depths increase the relative area of the chip consumed by combinatorial logic, making combinatorial logic much more susceptible to soft errors (e.g. particle strikes). For example, combinatorial logic consumes 58% of the total cell area of the ARM926EJS core designed by ARM Limited of Cambridge, England. Second, larger logic depths typically imply a wider signal fan out, thus increasing the number of potential targets which may latch an incorrect value caused by a single soft error. Soft error rates are also increasing in the sequential logic such as latches and registers and soft errors at these points also propagate through the fanout net.

It is known to provide mechanisms for detecting and correcting soft errors in memory systems such as SRAM. Memory devices typically use small geometries due to the desire to achieve high density. These small geometries are more vulnerable than the larger circuit elements that have previously typically been used in combinatorial and other logic within an integrated circuit, such as a microprocessor. Within memory systems error checking mechanisms, such as ECC codes, parity bits and the like, have been employed in an attempt to address this soft error problem. Whilst these techniques work in the context of high density memory systems storing effectively pure state data, they are not suited to protection against soft errors occurring dynamically within combinatorial logic and the like in more general purpose integrated circuits.

It may be possible to introduce error detection and error correction mechanisms throughout an integrated circuit design to protect essentially all nodes within that design. However, such an approach is impractical since a large increase in gate count would result due to the deployment of error detection and error correction mechanisms for almost every element within the design.

CALDWELL D W ET AL.: "A minimalist hardware architecture for using commercial microcontrollers in space" 26 Oct. 1997 (1997-10-26), DIGITAL AVIONICS SYSTEMS CONFERENCE, 1997. 16$^{th}$ DASC., AIAA/IEEE IRVINE, CA, USA 26-30 Oct. 1997, NEW YORK, NY, USA, IEEE, US, PAGE(S) 52-26, XP010256067 ISBN:0-7803-4150-3 discusses hardware considerations for using commercial microcontrollers in space applications. The motivations for starting with commercial devices and the concerns associated with their use are presented. The advantages of software versus hardware voting schemes to mitigate single-event effects are discussed. Interprocess communications approaches and schemes for improving I/O robustness are presented.

Viewed from one aspect the present inventions provides an integrated circuit comprising:

a plurality of circuit units operable to perform respective data processing operations;

a plurality of error isolation gates positioned to control signal paths between circuit units and operable in a closed state to block changes in respective signals being passed between circuit units and in an open state to permit changes in respective signals being passed between circuit units; and an isolation gate controller responsive to a current state of said integrated circuit to control respective ones of said plurality of error isolation gates to be in said closed state or said open state, wherein said isolation gate controller controls said error isolation gates such that at least one circuit unit is an error isolated circuit unit powered in said current state and not being used in said current state to perform a data processing operation to determine one or more output signals from said error isolated circuit unit, said error isolated circuit unit being surrounded by error isolation gates in said closed state such that a signal error arising within said error isolated circuit unit is blocked from propagating to other circuit units.

The invention recognises that errors occurring within an integrated circuit tend to have a random distribution over the integrated circuit in question. However, not all portions of an integrated circuit are active at any given time. Some portions of an integrated circuit may be powered down at a particular point in time to save energy. Errors within such powered down regions are unlikely to cause a problem. However, other areas within an integrated circuit may be powered, but nevertheless inactive at a particular time due to the current data processing operations and/or status of the integrated circuit in question. However, despite being unused at that particular point in time, errors occurring within these unused regions can propagate out of those unused regions and cause errors or failures in the integrated circuit as a whole. This technique provides error isolation gates positioned to control signal paths between circuit units so as to be closed or open. An isolation gate controller is responsive to the current state of the integrated circuit to control these isolation gates such that circuit elements which are powered, but are not being used in the current state to perform data processing operations to determine one or more output signals from those circuit units are isolated such that a signal error arising within the isolated circuit unit is blocked from being propagated to other circuit units. The isolated circuit unit may spontaneously recover from the error which has occurred or the error may be proactively detected and error recovery mechanisms initiated. By the time the isolated circuit unit is again required to take part in the processing operations of the integrated circuit it is possible that it has recovered from its error such that processing many continue unhindered. If the isolated circuit unit has still not recovered, then error recovery mechanisms may be initiated in a controlled way.

The signal errors against which this technique is particularly useful are transitory errors, such as errors induced by particle strikes.

The current state of the integrated circuit used by the isolation gate controller to determine which circuit units are active and which are inactive so as to appropriately isolate the inactive circuit units can include a variety of inputs including one or more program instructions currently being processed and a current processing mode of the integrated circuit.

The error isolation gates can operate in a variety of different ways, but particularly preferred ways include latching an output of an isolated circuit unit so that it will not change irrespective if internal signal changes due to errors within that isolated circuit unit and controlling a selection input of a multiplexer such that an output from an inactive circuit unit will not be selected erroneously given the current state of the integrated circuit.

Examples of isolated circuit units to which the present technique would be particularly applicable include instruction decoders not operable in a current mode of operation, a debug circuit not operable in a current mode of operation, and a portion of a data path not operable for any program instructions currently being processed. Other circuit units may also be isolated in accordance with this technique.

Viewed from another aspect the present invention provides a method of reducing error propagation within an integrated circuit, said method comprising the steps of:

performing respective data processing operations with a plurality of circuit units;

controlling signal paths with a plurality of error isolation gates positioned between circuit units and operable in a closed state to block changes in respective signals being passed between circuit units and in an open state to permit changes in respective signals being passed between circuit units; and in response to a current state of said integrated circuit controlling respective ones of said plurality of error isolation gates to be in said closed state or said open state, wherein said error isolation gates are controlled such that at least one circuit unit is an error isolated circuit unit powered in said current state and not being used in said current state to perform a data processing operation to determine one or more output signals from said error isolated circuit unit, said error isolated circuit unit being surrounded by error isolation gates in said closed state such that a signal error arising within said error isolated circuit unit is blocked from propagating to other circuit units.

Embodiments of the invention will now be described, by way of example only, with reference to the accompanying drawings in which.

Figure 1:
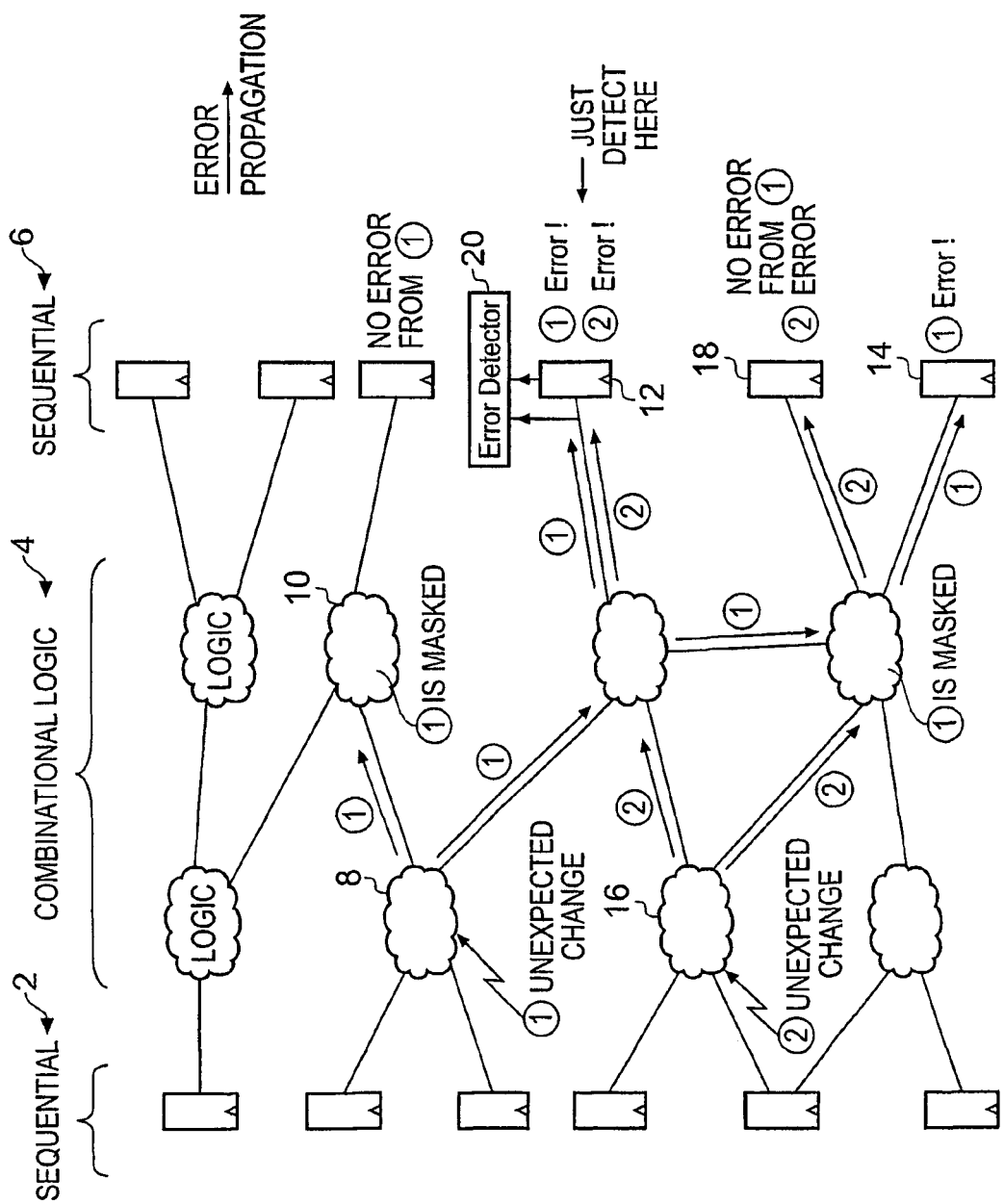
FIG. 1 illustrates a portion of an integrated circuit showing registers forming sequential logic and interconnected by combinatorial logic.

FIG. 1 shows a first set of registers 2 storing signal values at a particular clock edge. These signal values are then subject to signal processing operations within combinatorial logic 4 before the results of those processing operations are captured and stored within a further set of registers 6. This abstraction of a portion of an integrated circuit is generally applicable to the control and general purpose processing circuits within many integrated circuit designs. The combinatorial logic 4 can have a large depth depending upon the clock rate and is typically highly complex and difficult to analyse in behaviour other than with automated tools.

FIG. 1 shows an unexpected change being injected into a simulation of the operation of this portion of the circuit within combinatorial logic node 8. Such an unexpected change simulates the occurrence of a soft error, such as due to a particle strike, or some other transitory error. The unexpected change resulting from this injected error propagates to other nodes within the combinatorial logic 4 as is illustrated. This propagation takes place with a characteristic fan-out pattern from the source which may be dependent upon the current state of other signals within the system design as a whole. As an example, the node 10 is illustrated in this example as serving to mask the error which has been inserted at node 8, but in another state of the integrated circuit which may be simulated at a different time the node 10 may pass that error. This complex and state dependent nature of the fan-out characteristics is one reason why simulation of error injection over variety of integrated circuit states is desirable. Furthermore, simulation of error injection whilst simulating the execution of actual application code may be desirable since the states in which the integrated circuit will be when simulating application code execution will tend to be better correlated to those states which would actually occur in use of the integrated circuit.

As will be seen from FIG. 1, the error injected at node 8 is subsequently latched in registers 12 and 14. A further error is then simulated as being injected at node 16. This further error then propagates in accordance with its own fan-out characteristics and is similarly subject to masking or non-masking at various points and eventually is latched within registers 12 and 18.

In this highly simplified example it will be seen that errors injected at both nodes 8 and 16 result in an error being latched in register 12 and accordingly it is efficient to deploy an error detection circuit 20 in association with the register 12 since this is able to detect errors from these multiple sources. Other positions are also possible depending upon the logic functions and nodes concerned. It will be appreciated that the complexity of a real integrated circuit design and the large amount of different states it may occupy will result in the simulation of many thousands of injected errors so as to statistically analyse the registers at which resulting errors are most likely to be manifested and which detect errors from multiple sources. Error detectors 20 may also be placed in positions known to represent key architectural state or in positions at which errors can manifest themselves and which are not detected by error detectors at other positions even though those errors are rare since it may be desirable to achieve a particularly thorough error coverage. Another possibility provided by the present technique is to position the detection circuits further upstream in the logic path and not necessarily at the registered edges. This would give higher coverage in the middle; a possible disadvantage is that some of these errors may have been removed due to subsequent masking, but overall detection coverage may improve. Furthermore, objective degrees of confidence in the coverage may be obtained.

In the example discussed further a Verilog model of an ARM926EJS microprocessor was used. This microprocessor is a 32-bit embedded architecture microprocessor and has a five stage pipeline consisting of fetch, decode, execute, memory and write-back stages. The implementation used in this analysis has thirty seven architecturally defined registers (thirty one general purpose registers and six status registers), 4 KB of instruction cache and 4 KB of data cache. The Verilog model was synthesised with scan-chain insertion and design-for-test methodologies in place using a 130 nm process.

The test bench was formed including a pair of the synthesised netlists from the above, namely a reference design and a design under test. Both netlists are annotated with timing information gathered at the synthesis and layout stage by the synthesis and layout tools. The test bench also includes a behavioural memory model which is used to load benchmarks at simulation initialisation.

The soft error injection and analysis framework is composed of a set of Verilog Programming Interface libraries which are invoked at the start of simulation. Upon invocation, the framework probes the design in order to derive the set of all sequential state elements and nets within the unit under test.

Application-based analysis and random-state analysis are both supported. Application-based analysis is carried out by running benchmark code loaded into the behavioural memory model at simulation initialisation. In this case, the framework will, for example, select a random point in time between 2500 and 5000 cycles after the start of simulation to conduct its first fault injection. If the experiment being conducted is intended to include temporal masking analysis then the fault injection time is randomly selected in picoseconds, the fault duration is randomly selected, for example, on the interval (0.25*CLK, CLK). The preceding are only example timings and it would be possible to use other or random timings. Otherwise, the fault injection time will be scheduled at some future rising edge of the clock signal and will held for the duration of one clock cycle. When random state analysis is conducted, the framework is used to drive the experiments by setting the machine to a randomly generated state, injecting a fault, observing the effects of the fault in the subsequent cycle, and repeating. The random-state based experiments are meant to derive an application-independent measure of logical masking of errors.

At fault injection time, depending upon the type of injection experiment being simulated (soft errors in combinatorial logic, soft errors in sequential state, or both), a random design element is selected for fault injection from the unit under test. If the fault is to be injected into a logic element, a random net in the design is selected and the value present on a wire is inverted, simulating an upset at the logic gate which drives the wire. Similarly, when faults in registers are being simulated, a random register is selected and its output is inverted. When a fault is injected into the design, the framework logs the fault site, the time of injection, and a pulse duration.

After a fault has been injected into the system, at each subsequent arising clock edge, every microarchitectural register in the unit under test is compared against its dual in the reference design. Further, all top-level output ports on the design (I/O buses, coprocessor interface, test equipment) and inputs into the caches are checked to ensure that no corrupt values have escaped from the core data path. If, in the first cycle after fault injection, no register, cache or top-level port mismatches occur, then the injected fault did not effect the system, and so a new random time for example, at least 100 cycles in the future is selected for another fault injection experiment. If any register, cache or port mismatches do occur, then the fault analysis framework logs the relative cycle and site of the error for later analysis. The fault analysis framework then continues to track the progress of errors throughout the system for 100 cycles after fault injection time. If after 100 cycles, no errors are present, and no errors have propagated out to the caches or top-level ports, then the system is clean and the fault was successfully masked, so a new random time for fault injection is selected. If top-level port or cache errors did occur, then simulation halts and error logs are written for post-processing to analyse propagation behaviour and architectural state effects.

Figure 2:
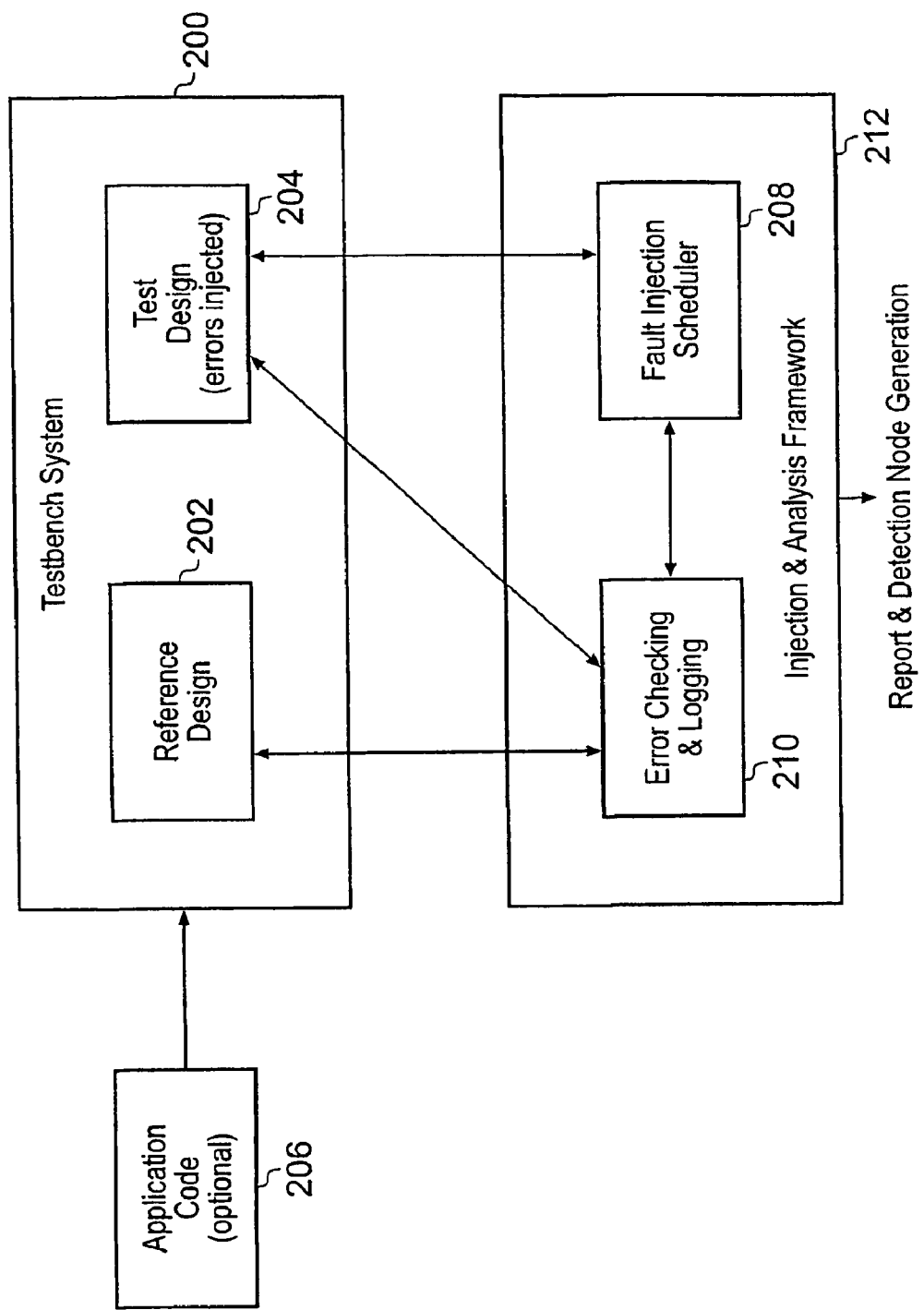
FIG. 2 shows a high level overview of an error injection and analysis framework.

FIG. 2 shows a high level overview of the error injection and analysis framework. Within a testbench system 200 a reference design instance 202 and a test design instance 204 are simulated. These simulations proceed in parallel running the same application code 206 or starting from the same random state. Signal errors are injected by the fault injection scheduler 208 into the test design 204. Differences in subsequent signal values are detected and logged by error checking and logging code and are indicative of error signal propagation. When the injection and analysis framework 212 has collected enough data to be statistically valid, this is used to generate reports and suggested node locations for detection circuits.

Figure 3:
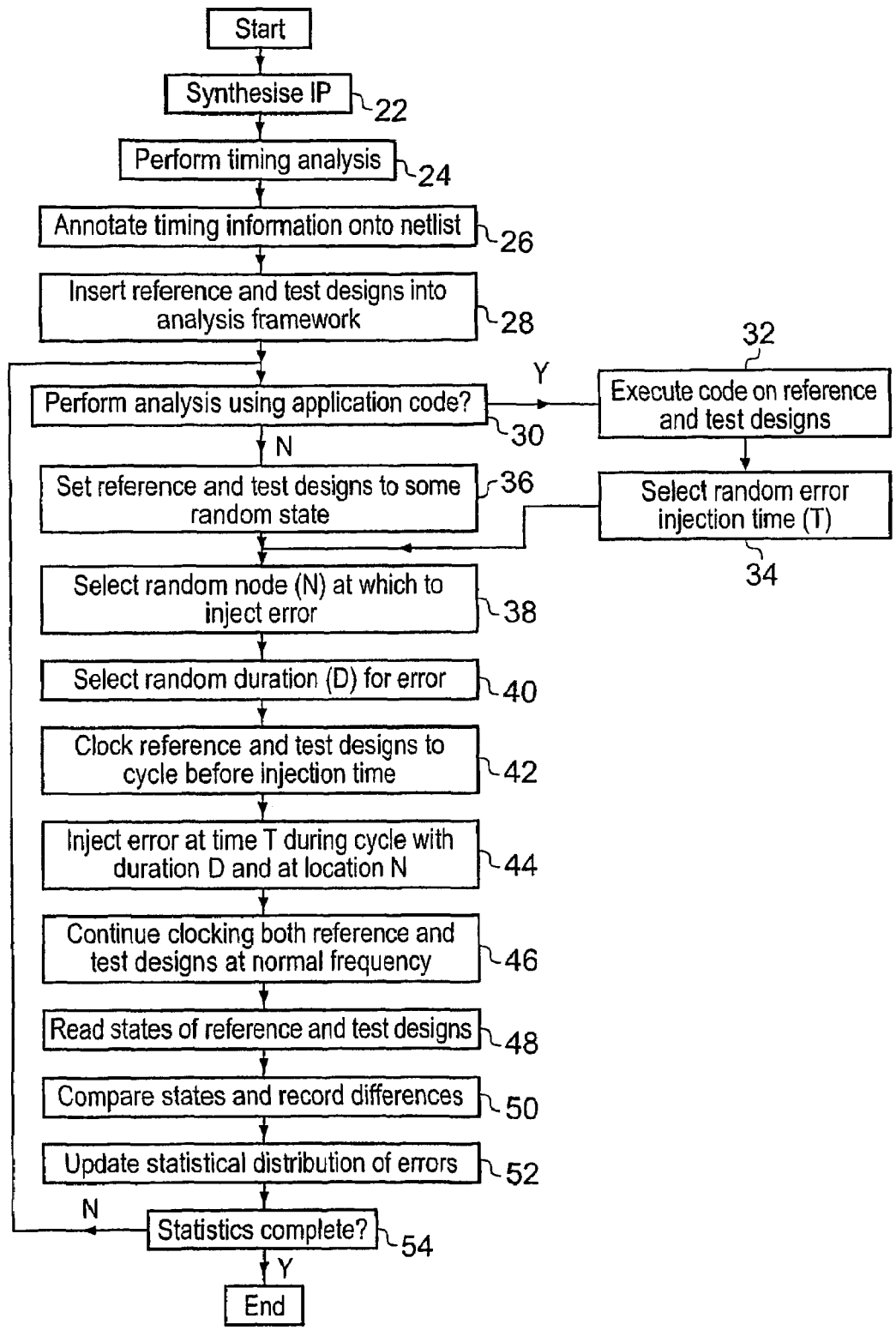
FIG. 3 is a flow diagram schematically illustrating the operation of error injection and analysis.

FIG. 3 is a flow diagram illustrating the analysis operation. At step 22 the integrated circuit design to be analysed is synthesised. At step 24 a timing analysis of this design is performed and then this timing information is annotated into the netlist for the design at step 26 such that a timing accurate simulation may be performed (this step is preferred, but may be omitted). At step 28, two instances of the design under test are inserted into the analysis framework of FIG. 2, namely a reference design and a test design. At step 30, a determination is made as to whether or not the analysis is to be performed using application code or random states. If application code is to be used, then step 32 executes this code, at least in simulation, on both the references and test designs and step 34 selects a random injection time for the error. If the analysis is not to be performed using application code, then processing proceeds to step 36 at which the reference and test designs are set to the same random state.

At step 38 a random node within the test design is selected at which the error is to be injected. This node may be a register or a piece of combinatorial logic or some other element. At step 40 a random duration for the error is selected. Step 42 then clocks the reference and test designs to the cycle before the selected injection time (most likely in the application code analysis example) and then at step 44 the signal error in injected at time T during the cycle reached with a duration D and at location N. Step 46 then continues the clocking of the reference and test designs such that the error can propagate within the test design. Step 48 reads the states of the reference and test designs and these are compared at step 50 to detect any differences. Detected differences are used to update the data recording the statistical distribution of errors resulting from error insertion as are being collected for analysis. If further statistics are required, then step 54 returns processing to step 30 and the simulation of error injection repeats.

Figure 4:
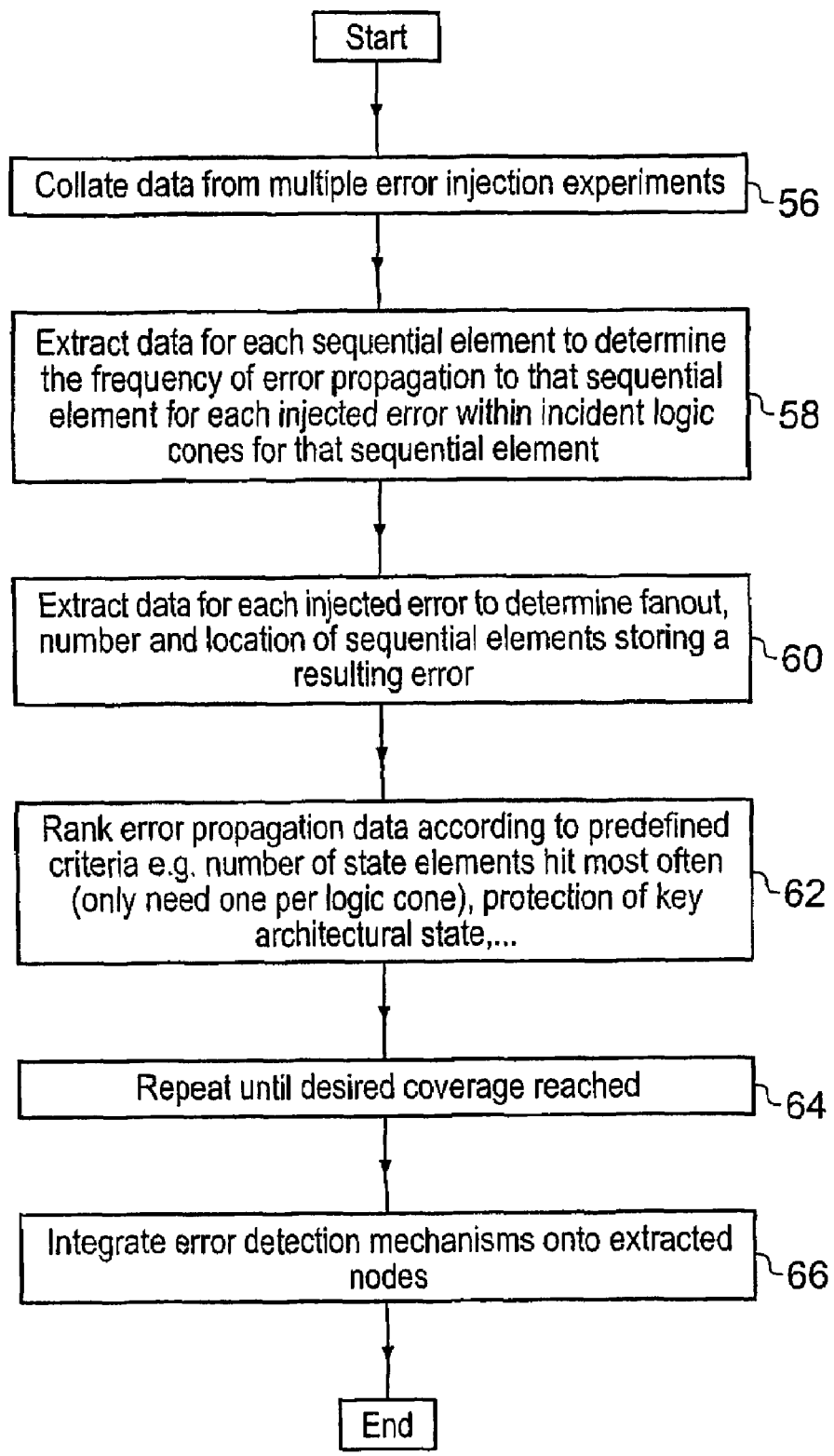
FIG. 4 is a flow diagram schematically illustrating how fan-out characteristics are used to select error detection circuit location.

FIG. 4 is a flow diagram schematically illustrating the analysis of the fan-out characteristics to determine error detector placement. At step 56 the data from multiple error injection experiments is collated. At step 58 each sequential element in the design (register) is analysed to determine the frequency of error propagation to that sequential element for injected errors within incident logic cones for that sequential element. In this way, sequential logic elements which are highly likely to detect an error when one occurs within one of their incident logical cones can be identified since these are good candidates to be used as error detector locations.

At step 60 each injected error location is examined to determine the fan-out, number and location of sequential elements which store a resulting error. In this way, the fan-out characteristics may be used to identify sequential logic elements (registers) which provide wide error detection coverage for errors injected at a variety of positions. Furthermore, error injection positions which are lacking in error detection coverage may be identified to produce a desired or comprehensive level of error coverage and also error injection points which may influence key architectural state can also be identified.

At step 62, the error propagation data (fan-out data) extracted in steps 58 and 60 is analysed such as by ranking in accordance with predetermined criteria to identify a suitable set of locations at which error detection circuits should be added. These error detection circuits can then be added to the design and the testing would be repeated to check that the coverage is as expected (the insertion of the error detection circuits may itself alter the error propagation behaviour). These repeating and integration steps are illustrated in steps 64 and 66 of FIG. 4.

Figure 5:
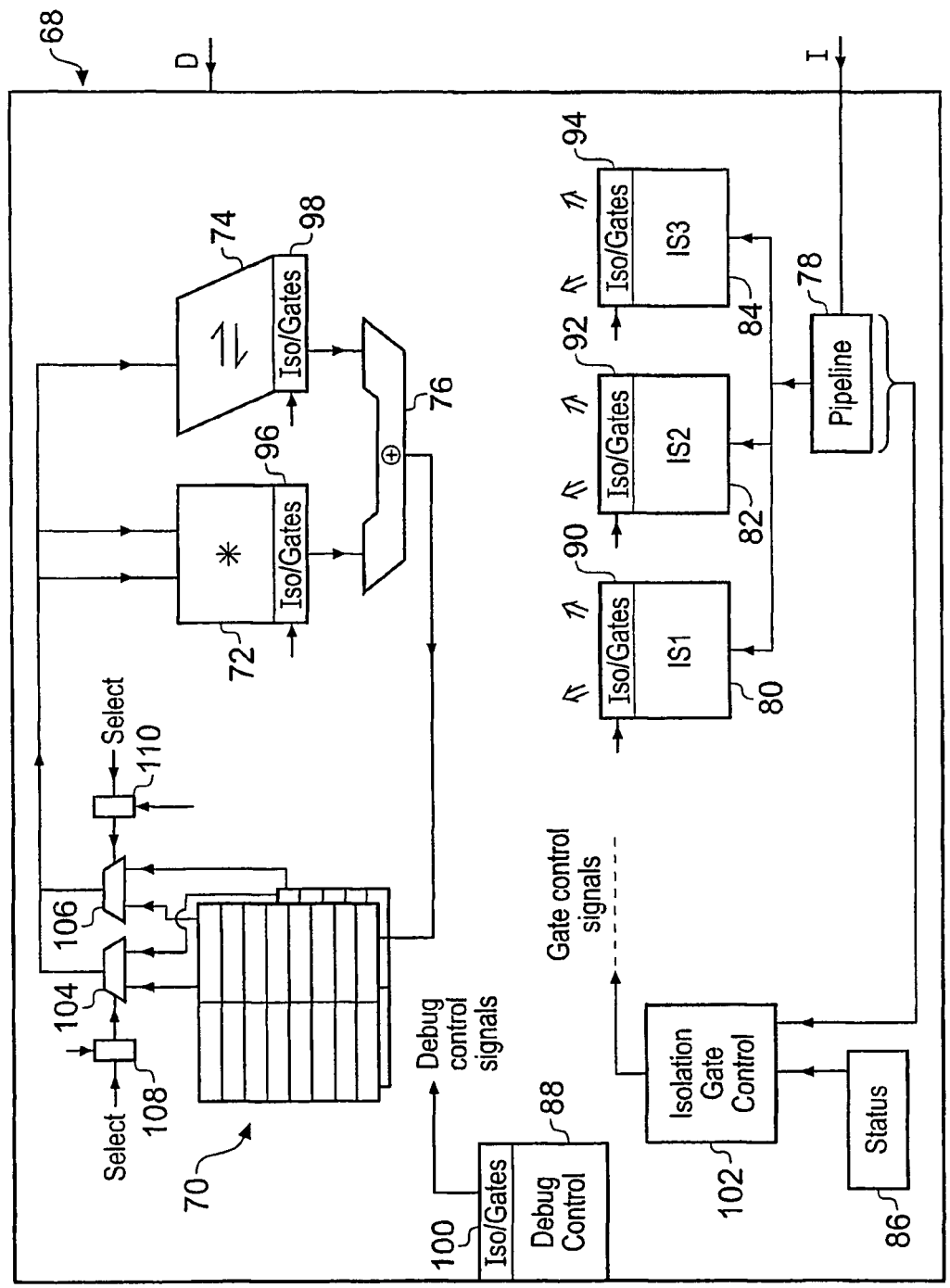
FIG. 5 is a diagram schematically illustrating an integrated circuit incorporating isolation gates controlled by an isolation gate controller in dependence upon a current state of the integrated circuit.

FIG. 5 schematically illustrates an integrated circuit 68 in which soft errors (e.g. resulting from particle strikes) may occur. Schematically illustrated in this integrated circuit are a data path comprising a register bank 70, a multiplier 72, a shifter 74 and an adder 76. The data path 70, 72, 74, 76 performs data processing operations under control of program instructions loaded into an instruction pipeline 79 and decoded by respective instruction set decoders 80, 82, 84. Only one of these instruction set decoders 80, 82, 84 will be active at a given time in dependence upon a current processing mode of the integrated circuit 68 as stored within a status register 86. The instruction decoders 80, 82, 84 produce control signals to control the elements of the datapath 70, 72, 74, 76.

Also illustrated in FIG. 5 are a debug control unit 88 which can be used to extract debug data from the integrated circuit 68 and apply debug data to the integrated circuit 68. Such a debug controller 88 will normally only be active in a debug mode of the integrated circuit 68 as controlled, for example, by a debug control bit within the status register 86.

Isolation gates 90, 92, 94, 96, 98, 100 are illustrated at various points within the integrated circuit 68. These isolation gates are controlled by an isolation gate controller 102 to selectively be in either a closed state or in an open state. In a closed state they serve to block any change occurring in an output signal of the circuit unit with which they are associated, whereas in an open state they pass such changes. The isolation gate controller 102 is responsive to the current state of the integrated circuit 68, including the current processing mode detected from the status register 8 and the currently executing program instructions detected from the pipeline 78, to generate gate control signals to control the isolation gates 90, 92, 94, 96, 98, 100. As an example, only one of the instruction decoders 80, 82, 84 will be active at any given time and accordingly the output signals from the other decoders will be isolated by their isolation gates 90, 92, 94 under control of the isolation gate controller 102 such that if any soft errors occur within an inactive instruction decoder 80, 82, 84, then these will not produce error signals that propagate out to the rest of the integrated circuit and induce errors in operation of that integrated circuit. As another example, the outputs from the shifter 74 may be subject to control by the isolation gates 98 such that if a particular processing state of the integrated circuit 68 is one which does not involve any shifting operations, then the output from the shifter 74 may be isolated such that it does not have an inappropriate effect on any subsequent processing.

The debug control signals from the debug controller 88 are also subject to isolation gate control since debug control signals can have a particularly powerful effect on the operation of the integrated circuit 68 and cause large scale errors if a soft error does occur within the debug controller 88.

As another example of isolation gate control, multiplexers 104 and 106 which are used to select main registers or shadow register within the register bank 70 (depending upon processing mode) are controlled with select signals which can be subject to isolation gates 108, 110. Thus, if the processing mode is one in which it is known that the shadow registers are not active, then the select inputs to the multiplexers 104, 106 can be subject to isolation such that soft errors will not induce them to inappropriately change the selected register and accordingly produce erroneous processing operation.

The invention claimed is:
1. An integrated circuit comprising:
a plurality of circuit units operable to perform respective data processing operations;
a plurality of error isolation gates positioned to control signal paths between circuit units and operable in a closed state to block changes in respective signals being passed between circuit units and in an open state to permit changes in respective signals being passed between circuit units; and
an isolation gate controller responsive to a current state of said integrated circuit to control respective ones of said plurality of error isolation gates to be in said closed state or said open state, wherein
said isolation gate controller controls said error isolation gates such that at least one circuit unit is an error isolated circuit unit powered in said current state and not being used in said current state to perform a data processing operation to determine one or more output signals from said error isolated circuit unit, said error isolated circuit unit being surrounded by error isolation gates in said closed state such that a signal error arising within said error isolated circuit unit is blocked from propagating to other circuit units, wherein at least one of said error isolation gates is operable to control a select input of a multiplexer such that said multiplexer does not select for transmission an output signal from said error isolated circuit unit.

2. An integrated circuit as claimed in claim 1, wherein said signal error is a transitory error.

3. An integrated circuit as claimed in claim 1, wherein said current state is dependent upon one or more program instructions currently being processed.

4. An integrated circuit as claimed in claim 1, wherein current state is dependent upon a current processing mode of said integrated circuit.

5. An integrated circuit as claimed in claim 1, wherein at least one of said error isolation gates is operable to latch an output signal from said error isolated circuit unit.

6. An integrated circuit as claimed in claim 1, wherein said error isolated circuit is:
- an instruction decoder not operable in a current mode of operation;
- a debug circuit not operable in a current mode of operation; and
- a portion of a data path not operable for any program instructions currently being processed.

7. A method of reducing error propagation within an integrated circuit, said method comprising the steps of:
- performing respective data processing operations with a plurality of circuit units;
- controlling signal paths with a plurality of error isolation gates positioned between circuit units and operable in a closed state to block changes in respective signals being passed between circuit units and in an open state to permit changes in respective signals being passed between circuit units; and
- in response to a current state of said integrated circuit, controlling respective ones of said plurality of error isolation gates to be in said closed state or said open state, wherein said error isolation gates are controlled such that at least one circuit unit is an error isolated circuit unit powered in said current state and not being used in said current state to perform a data processing operation to determine one or more output signals from said error isolated circuit unit, said error isolated circuit unit being surrounded by error isolation gates in said closed state such that a signal error arising within said error isolated circuit unit is blocked from propagating to other circuit units, wherein at least one of said error isolation gates controls a select input of a multiplexer such that said multiplexer does not select for transmission an output signal from said error isolated circuit unit.

* * * * *